United States Patent [19]
Hoeft

[11] 4,335,358
[45] Jun. 15, 1982

[54] CLASS "B" TYPE AMPLIFIER
[75] Inventor: Werner H. Hoeft, Santa Clara County, Calif.
[73] Assignee: Signetics Corporation, Sunnyvale, Calif.
[21] Appl. No.: 113,928
[22] Filed: Jan. 21, 1980
[51] Int. Cl.³ .......................... H03F 3/30; H03F 3/45
[52] U.S. Cl. ................................. 330/255; 330/257; 330/259; 330/260; 330/263
[58] Field of Search ............... 330/255, 257, 259, 260, 330/261, 263

[56] References Cited
U.S. PATENT DOCUMENTS
3,622,903 11/1971 Steckler .............................. 330/255
3,852,676 12/1974 Hongu et al. ....................... 329/103

*Primary Examiner*—James B. Mullins
*Attorney, Agent, or Firm*—Thomas A. Briody; Robert T. Mayer; Steven R. Biren

[57] ABSTRACT

A Class "B" amplifier circuit in which Class "B" conversion takes place in a converter portion of the circuit in combination with a differential amplifier input circuit, rather than in the output stage. The converter modulates the DC bias current supplied to the differential amplifier input circuit as a function of the input signal, in order to achieve Class "B" operation. The output amplifier portion of the circuit includes a pair of complementary, series-connected transistors, each of which is connected in a common-emitter configuration. The disclosed circuit provides a high input impedance and excellent dynamic range.

6 Claims, 1 Drawing Figure

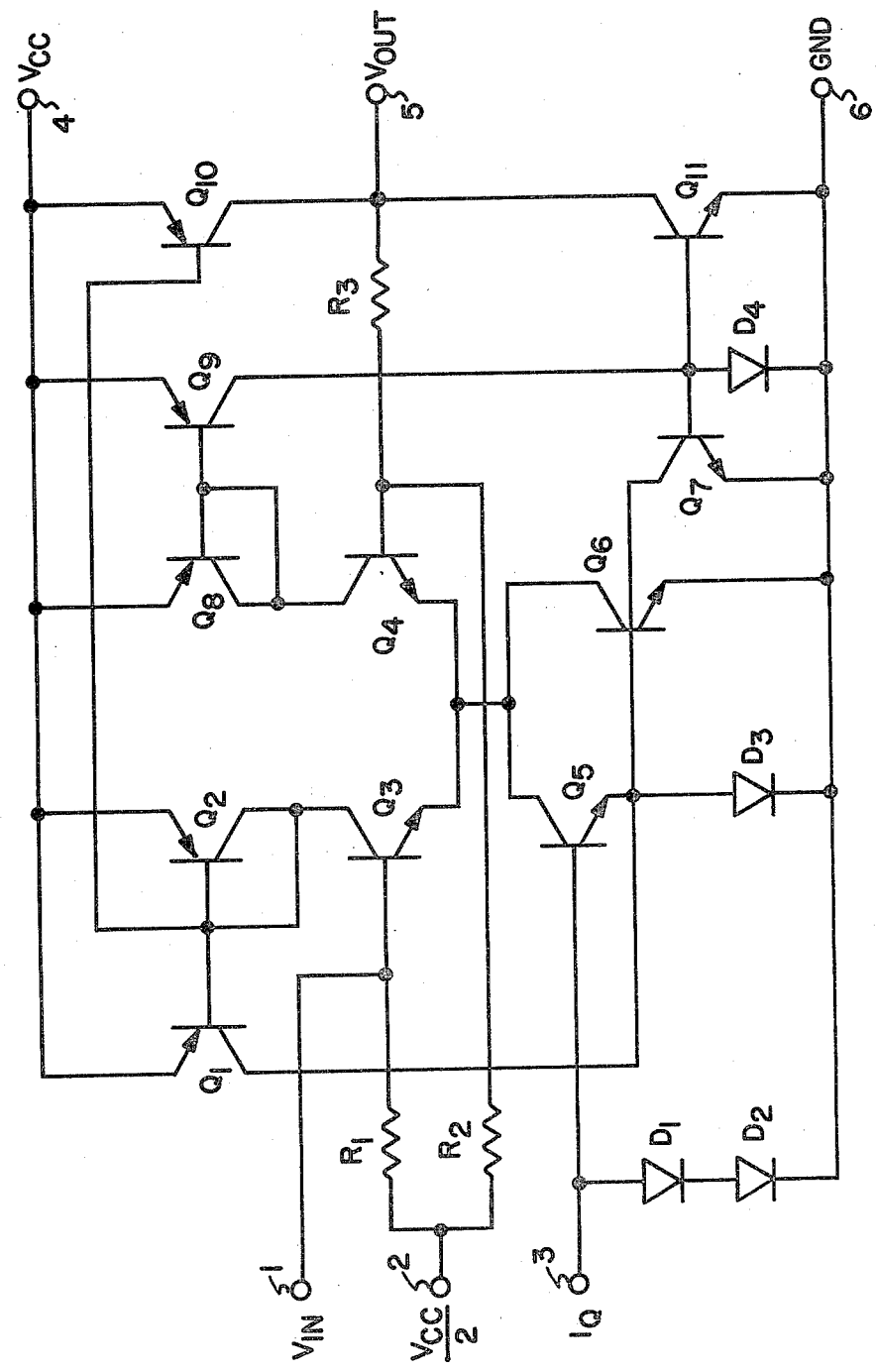

CLASS "B" TYPE AMPLIFIER

BACKGROUND OF THE INVENTION

This invention relates to a Class "B" amplifier circuit of the type which uses a Class "B" converter to obtain the desired mode of operation.

Typical prior art Class "B" type amplifiers are shown in U.S. Pat. Nos. 3,573,645 (FIG. 3) and 3,786,364 (FIG. 4). While these amplifier circuits provide Class "B" operation, they suffer from a number of drawbacks. Since the two prior art circuits are basically similar as they relate to the present invention, the more basic circuit shown in FIG. 3 of U.S. Pat. No. 3,573,645 will be described. In FIG. 3, an AC input signal is provided to a single-ended low impedance input node at the junction of the emitter of transistor 11 and the base of transistor 12. The input signal is processed by a push-pull phase splitter composed of transistors 11 and 12 and their associated circuitry (as shown in FIG. 1 of the patent). The outputs of this push-pull phase splitter are then coupled to an output stage which operates in a Class "B" mode. However, a number of disadvantages result from applying the AC input signal directly to the phase splitter and then using the phase splitter output to drive an output stage operating in the class "B" mode.

First, this configuration provides a low input impedance for the AC signal, which may present problems in certain applications. Furthermore, in order to achieve the necessary current gain in the output stage as required by this configuration, the prior art circuit of FIG. 3 employs a current amplifier configuration in which there are two base-emitter junctions (of transistors 28 and 25) connected between one output of the phase splitter and the circuit output terminal 27. This results in a voltage drop of approximately 1.4 volts between the phase splitter and the output terminal of the circuit, which serves to limit the dynamic range of the circuit. Since this voltage drop remains substantially constant regardless of the power supply voltage used, it will be seen that this problem becomes increasingly significant in low-voltage applications, where the voltage drop due to the series-connected base-emitter junctions may constitute a significant portion of the total dynamic range available.

In FIGS. 4 and 5 of U.S. Pat. No. 3,852,676 there are shown circuits which superficially resemble the Class "B" converter portion of the circuit of FIG. 1 of the present invention. However, these prior art circuits are detector circuits, rather than Class "B" converters for use in amplifiers. The prior art circuits are used standing alone, and there is no suggestion in the accompanying specification that the detector circuits disclosed therein could be used as part of a Class "B" amplifier. Furthermore, the detector circuits of FIGS. 4 and 5 incorporate an RC time constant (R5-C2) which serves to filter or smooth the output signal, thus making the circuits of U.S. Pat. No. 3,852,676 totally unsuitable for use in the present invention.

SUMMARY OF THE INVENTION

An object of the invention is to provide a Class "B" amplifier circuit in which the Class "B" conversion takes place in a converter portion of the circuit in combination with a differential amplifier input circuit, rather than in the output stage.

A further object of the invention is to provide a Class "B" amplifier circuit having the greatest possible dynamic range to permit efficient operation at low power supply voltages.

Yet another object of the invention is to provide a Class "B" amplifier circuit having a high input impedance.

In accordance with the invention, these objects are accomplished by a new class "B" amplifier circuit in which Class "B" conversion is accomplished in a Class "B" converter which is associated with a high-impedance differential amplifier input circuit. Furthermore, by using a Class "B" converter circuit in accordance with the invention, it is possible to eliminate the need for an emitter-follower type output stage typical of prior art circuits such as those shown in U.S. Pat. Nos. 3,573,645 and 3,786,364.

The present invention is based upon the use of a Class "B" converter circuit which is coupled to a high input impedance differential amplifier input circuit, and an output amplifier circuit in which there are no base-emitter junctions connected in series with the signal output path. In this manner, the maximum possible dynamic range is realized and the circuit is capable of operating efficiently at low power supply voltages.

In a preferred embodiment of the invention, an output terminal of the converter is connected to a current bias terminal of the differential amplifier to provide a modulated DC bias signal thereto, and the differential output terminals of the differential amplifier are in turn coupled to a current summing node of the Class "B" converter circuit. The differential output terminals of the differential amplifier are also coupled to the output amplifier circuit of the Class "B" amplifier, with no series-connected base-emitter junctions in the output circuit.

Class "B" conversion is accomplished by a simple but efficient converter circuit which includes first and second bipolar transistors, the emitter of the first transistor being connected to the base of the second. A pair of diodes are connected in series with like polarity between the base zone of the first transistor and the ground or common circuit point, and a bias input current is provided to this base zone and the diodes. The emitter zone of the first transistor is connected to the common circuit point through a third diode, and the emitter zone of the second transistor is connected directly to the common circuit point. The collector zones of the two transistors are connected together and to the current bias terminal of the differential amplifier circuit. The basic purpose of this converter circuit is to modulate the DC bias current which is supplied to the differential amplifier as a function of the input signal, thus obtaining class "B" operation.

The output terminal of the Class "B" amplifier is connected to the collectors of a pair of complementary, series-connected transistors, each of which is connected in a common-emitter configuration. Since the Class "B" amplifier output signal is taken from the collectors of a pair of common-emitter configured transistors, a substantial improvement in dynamic range as compared to the emitter-follower output circuits of prior art amplifiers is achieved.

BRIEF DESCRIPTION OF THE DRAWING

The single FIGURE is a schematic diagram of a Class "B" amplifier circuit in accordance with a preferred embodiment of the invention.

DETAILED DESCRIPTION

A preferred embodiment of a Class "B" amplifier circuit in accordance with the invention is shown in the single FIGURE of the drawing. An input signal $V_{in}$ is applied to an input terminal 1 which is connected to the base zone of a transistor Q3 of a differential amplifier input circuit which comprises transistors Q3 and Q4. These transistors, which are of like type, have their emitter zones connected together to form a current bias terminal, while their collector zones form the differential output terminals of the input circuit.

The current bias terminal of the differential amplifier input circuit is connected to a Class "B" converter circuit comprising transistors Q5 and Q6, of like type, along with diodes D1, D2 and D3. It should be understood that, in this specification, whenever the term diode is used, or a diode symbol is shown, a diode-connected transistor (that is, a transistor with its base and collector zones connected together) is in fact intended. In the FIGURE, transistors Q2 and Q8 are illustrated as diode-connected transistors, while the remaining diode-connected transistors (D1, D2, D3 and D4) are shown as diodes for simplicity.

As shown in the FIGURE, the collector zones of transistors Q5 and Q6 are connected together to form the converter output terminal, and this output terminal is connected to the current bias terminal of the differential amplifier. A DC bias input current $I_q$ is applied to input terminal 3 of the converter circuit, and this terminal is connected both to the base zone of transistor Q5 and to diode D1, diodes D1 and D2 being connected in series with like polarity between terminal 3 and ground terminal 6, which is the common terminal of the circuit. The emitter zone of transistor Q5 and the base zone of transistor Q6 are connected together to form an AC current summing node, and diode D3 is connected between this summing node and ground terminal 6. To complete the converter circuit, the emitter zone of transistor Q6 is connected directly to the common or ground terminal 6.

The differential amplifier output terminals at the collector zones of transistors Q3 and Q4 are connected, respectively, to the inputs of first and second current mirrors Q1–Q2 and Q8–Q9. The output of the first current mirror Q1–Q2 is connected to the AC current summing node of the Class "B" converter circuit via the collector zone of transistor Q1, while the second current mirror Q8–Q9 is coupled to the AC current summing node of the converter via the collector zone of transistor Q9 and a third current mirror comprising diode D4 and transistor Q7.

The output amplifier circuit of the Class "B" amplifier includes first and second bipolar output transistors Q10 and Q11 of opposite (complementary) types connected in series between a voltage supply terminal 4 and the common or ground terminal 6. The collector zones of transistors Q10 and Q11 are connected together and to the output terminal 5 of the circuit. Thus, both output transistors Q10 and Q11 are connected in a common-emitter configuration, and there are no output amplifier base-emitter junctions in series with the output signal path to terminal 5.

The input terminals of the output amplifier circuit, at the base zones of output transistors Q10 and Q11, are coupled back to the differential output terminals of the differential amplifier input circuit. Specifically, the base zone of transistor Q10 is connected to the junction of the base zones of transistors Q1 and Q2 of the first current mirror and the collector zone of transistor Q3, while the base zone of output transistor Q11 is coupled to the collector zone of differential amplifier transistor Q4 via the collector zone of transistor Q9 of the second current mirror Q8–Q9.

The amplifier circuit is biased and stabilized by a resistor network comprising resistors R1, R2 and R3. Resistors R1 and R2 are connected from a bias terminal 2 (which receives a voltage equal to one half of the power supply voltage $V_{cc}$ applied to terminal 4) to the base zones of transistor Q3 and Q4, respectively, while resistor R3 is connected from the output terminal 5 to the base zone of transistor Q4. Resistor R1 serves to bias the input stage of the differential amplifier, while resistors R2 and R3 set the output quiescent bias point and provide negative feedback for stability and gain control in a conventional manner.

Quiescent or steady-state biasing conditions are established in the circuit of the FIGURE by applying a desired quiescent bias current $I_q$ to terminal 3. This will establish equal DC currents in transistors Q5 and Q6 of the Class "B" converter under steady-state conditions since the converter transistors all have like geometries. The steady-state current appearing at the converter output terminal (the junction of the collector zones of transistors Q5 and Q6) establishes the quiescent DC bias current at the junction of the emitter zones of transistors Q3 and Q4 of the differential amplifier input circuit. Under steady-state conditions this bias current will divide equally between transistors Q3 and Q4, so that the quiescent current through transistors Q3, Q4, Q5 and Q6 will be the same.

The quiescent collector current flowing in transistor Q3 will be mirrored through the current mirror Q1–Q2 to provide a current output from the collector of Q1 to the AC current summing node of the Class "B" converter. The emitter geometries of transistors Q1 and Q2 are selected such that the current mirror Q1–Q2 will have a current multiplication factor of 2. Similarly, the collector current of transistor Q4 is mirrored by current mirror Q8–Q9 and a further current mirror D4–Q7, with the collector of Q7 being connected to the converter AC current summing node. Again, the current multiplication factor from the collector zone of transistor Q4 to the AC current summing node is 2, and this factor may be achieved by selecting the appropriate emitter geometry ratios in the current mirrors in this path. In order to achieve the desired Class "B" mode of operation, the current multiplication factor from each collector of the differential amplifier input circuit to the AC current summing node of the converter should be greater than one but no more than two. With a current multiplication factor of one or less, Class "B" operation will not be achieved, while with a multiplication factor of greater than two, instability may result.

Under steady-state conditions, a constant and equal bias current will flow through each of the transistors Q3, Q4, Q5 and Q6, while a current of twice this value will flow through transistors Q1 and Q7 due to the selected geometry ratios as discussed above. Thus, at the AC current summing node at the emitter zone of transistor Q5, the current flowing into the node from the collector zone of transistor Q1 will exactly equal and be balanced by the current flowing out of the node into the collector zone of transistor Q7. Accordingly, the current mirroring arrangement described above will have no effect on the steady-state operation of the Class "B" converter circuit.

The base-emitter junctions of output transistors Q10 and Q11 are connected in parallel with the base-emitter zones of transistors Q1 and Q7, respectively, so as to also mirror the currents originating from transistors Q3 and Q4. However, the emitter geometries of transistors Q10 and Q11 are selected to achieve a current multiplication ratio of approximately four. This current multiplication ratio is not critical, and a ratio anywhere in the range of from about one to ten would be appropriate.

Under large-signal operating conditions, a Class "B" mode of operation is obtained by modulating the AC current summing node of the converter circuit with the multiplied currents generated at the collectors of current mirror transistors Q1 and Q7. Absent the multiplication factor, the instantaneous value of the total current flowing through transistors Q5 and Q6 (that is, the bias current applied to the differential amplifier circuit) would remain substantially constant, and Class "B" operation would not be achieved. However, with the specified current multiplication factor in the current mirrors supplying current to the AC current summing node, as described above, the instantaneous value of the bias current supplied to the differential amplifier does not remain constant, but rather is modulated as a function of the input signal.

For example, when a positive-going signal excursion is applied to input terminal 1, the collector current through input transistor Q3 will increase, thus causing a further increased current (due to the multiplication factor of the current mirror Q1–Q2) to flow into the AC current summing node of the Class "B" converter. At the same time, the positive-going input signal will cause a decrease in the collector current of Q4, which will result in a similarly-multiplied decrease in current flowing out of the AC current summing node and into the collector of transistor Q7. The increased current into the AC current summing node, proportional to the input signal, will result in an increase in base current in transistor Q6, which will in turn cause a proportional increase in the collector current in transistor Q6, while at the same time the collector current through transistor Q5 will decrease toward zero. Thus, the bias current supplied to the differential amplifier current bias terminal will be substantially equal to the collector current of transistor Q6 for positive large-signal excursions and this current will be proportional to the current provided from the collector zone of transistor Q1. Since the current supplied by transistor Q1 is a multiplied function of the current generated in the collector of transistor Q3 due to the input signal, it will be seen that the net bias current provided to the differential amplifier circuit will increase proportional to the increase in signal current, thus achieving Class "B" operation.

Similarly, for a negative-going signal input, the collector current in transistor Q3 will decrease while the collector current in transistor Q4 will increase. The increased collector current in transistor Q4 will be multiplied and reflected through the current mirrors Q8–Q9 and D4–Q7 to provide a multiplied increased current proportional to the input signal out of the AC current summing node at the emitter of Q5 and into the collector zone of transistor Q7. At the same time, the current provided into the AC summing node by the collector of transistor Q1 will decrease. As the current flow through the collector zone of transistor Q7 increases, the current through transistor Q6 will decrease toward zero, while the current through transistor Q5 will continue to increase. Again, as in the case of a positive-going input signal, for a negative large-signal excursion the increase in bias current supplied by the more heavily conducting transistor of the converter will cause a net increase in bias current provided to the differential amplifier due to the current multiplication factor provided by the current mirrors.

It is this net increase in bias current, for both positive-going and negative-going inputs, which enables the circuit to operate in a Class "B" mode. With matched betas in transistors Q5 and Q6, and matched geometries in the current mirrors as described above, a symmetrical current bias signal, with an instantaneous value proportional to the absolute value of the input signal, will be provided to the differential amplifier current bias terminal by the Class "B" converter for large-signal inputs. In this manner, Class "B" operation is achieved by a Class "B" converter circuit which provides a modulated bias current proportional to the input signal to the differential amplifier current bias terminal.

While the invention has been particularly shown and described with reference to a preferred embodiment thereof, it will understood by those skilled in the art that various changes in form and detail may be made without departing from the spirit and scope of the invention.

I claim:

1. A Class "B" type amplifier circuit, which comprises:
   differential amplifier input circuit means having a single-ended signal input terminal, a current bias terminal and first and second differential output terminals;
   Class "B" converter circuit means having an input terminal for receiving a DC bias input current, an AC current summing node, a converter output terminal and a common terminal, said converter output terminal being connected to the current bias terminal of said differential amplifier to provide a modulated DC bias signal thereto, and said first and second differential output terminals being operatively coupled to said current summing node; and
   output amplifier circuit means having first and second input terminals operatively coupled to said first and second differential output terminals, respectively, and a single-ended output terminal for providing an amplified output signal with respect to said common terminal.

2. An amplifier circuit as in claim 1, wherein said Class "B" converter circuit means further comprises first and second bipolar transistors of like type, each having base, emitter and collector zones, the base zone of said first transistor being connected to said converter input terminal, the collector zones of said first and second transistors being connected together and to said converter output terminal, the emitter zone of said first transistor being connected to the base zone of said second transistor to form said current summing node, and the emitter zone of said second transistor being connected to said common terminal; first and second diodes connected in series with like polarity between the base zone of said first transistor and said common terminal; and a third diode connected from said current summing node to the common terminal.

3. An amplifier circuit as in claim 2, further comprising first and second current mirrors for operatively coupling said first and second differential output terminals, respectively, to said current summing node.

4. An amplifier circuit as in claim 3, further comprising a third current mirror for coupling the output of said second current mirror to said current summing node.

5. An amplifier circuit as in claim 4, wherein the current multiplication factor of said first current mirror, and the combined current multiplication factor of said second and third current mirrors, are each greater than one but no more than two.

6. An amplifier circuit as claimed in claim 5, wherein said output amplifier circuit means further comprises first and second bipolar output transistors of opposite types, each having base, emitter and collector zones, the base zones of said output transistors comprising said first and second output amplifier input terminals, said base zones being connected, respectively, to said first and second current mirrors, the emitter zone of said first transistor being connected to a voltage supply terminal, the emitter zone of said second transistor being connected to the common terminal, and the collectors of said output transistors being connected together to form said amplifier output terminal.

* * * * *